US012689341B2

(12) United States Patent　(10) Patent No.:　US 12,689,341 B2

Gammie　(45) Date of Patent:　Jul. 21, 2026

(54) AMPLIFYING A DIFFERENTIAL VOLTAGE SIGNAL COMPONENT OF A VOLTAGE ACROSS A RESISTOR

(71) Applicant: Microchip Technology Incorporated, Chandler, AZ (US)

(72) Inventor: David Gammie, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 123 days.

(21) Appl. No.: 17/664,813

(22) Filed: May 24, 2022

(65) Prior Publication Data

US 2022/0376666 A1　Nov. 24, 2022

Related U.S. Application Data

(60) Provisional application No. 63/202,034, filed on May 24, 2021.

(51) Int. Cl.
H03F 3/45　(2006.01)
G01R 19/10　(2006.01)

(52) U.S. Cl.
CPC ......... H03F 3/45475 (2013.01); G01R 19/10 (2013.01)

(58) Field of Classification Search
CPC ............................ G01R 19/10; H03F 3/45475
See application file for complete search history.

(56) References Cited

U.S. PATENT DOCUMENTS

| | | | | |
|---|---|---|---|---|
| 6,617,838 B1 * | 9/2003 | Miranda | ............ | G01R 19/0092 |
| | | | | 327/451 |
| 2005/0275460 A1 * | 12/2005 | Botker | .................... | H03F 1/086 |
| | | | | 330/257 |
| 2013/0135047 A1 * | 5/2013 | Danioni | .............. | H03F 3/45475 |
| | | | | 330/252 |
| 2015/0280696 A1 | 10/2015 | Bernacchia et al. | | |
| 2019/0372531 A1 * | 12/2019 | Daigle | .................... | H03F 3/393 |

OTHER PUBLICATIONS

International Search Report for International Application No. PCT/US2022/072539, mailed Sep. 2, 2022, 5 pages.
International Written Opinion for International Application No. PCT/US2022/072539, mailed Sep. 2, 2022, 9 pages.

* cited by examiner

*Primary Examiner* — Feba Pothen
(74) *Attorney, Agent, or Firm* — TraskBritt

(57) ABSTRACT

One or more examples relate to an apparatus to amplify differential voltage signal components of voltage across a resistor. Such an apparatus may include a resistor; a differential amplification circuit operatively coupled with the resistor to amplify a differential voltage signal component of a voltage across the resistor; and an operative coupling between the resistor and the differential amplification circuit to pass the differential voltage signal component and isolate a common mode voltage signal component of the voltage across the resistor.

11 Claims, 7 Drawing Sheets

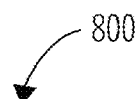

800

RECEIVE A VOLTAGE GENERATED ACROSS A RESISTOR <u>802</u>

PROVIDE A DIFFERENTIAL VOLTAGE SIGNAL COMPONENT OF THE VOLTAGE GENERATED ACROSS THE RESISTOR TO INPUTS OF A DIFFERENTIAL AMPLIFICATION CIRCUIT BY ALTERNATELY INTEGRATING AND TRANSFERRING THE DIFFERENTIAL VOLTAGE SIGNAL COMPONENT, AND ISOLATING A COMMON MODE VOLTAGE COMPONENT OF THE VOLTAGE GENERATED ACROSS THE RESISTOR <u>804</u>

FIG. 8

AMPLIFYING A DIFFERENTIAL VOLTAGE SIGNAL COMPONENT OF A VOLTAGE ACROSS A RESISTOR

CROSS-REFERENCE TO RELATED APPLICATION

This application claims the benefit under 35 U.S.C. § 119(e) of U.S. Provisional Patent Application Ser. No. 63/202,034, filed May 24, 2021, the disclosure of which is hereby incorporated herein in its entirety by this reference.

FIELD

One or more examples relate, generally, to differential amplification. Some examples relate to an operative coupling between a resistor and a differential amplifier that passes a differential voltage signal component of a voltage across a resistor and isolates a common mode voltage component of the voltage across the resistor.

BACKGROUND

Switching regulators work by transferring energy (e.g., via a voltage potential) from an input energy source (e.g., an input voltage source) to an output (e.g., a load), small chunks of energy at a time. An electrical switch and a controller regulate the rate at which energy is transferred to the output. Switching regulators may be transistor based, and when a transistor is OFF, no current flows and no power is dissipated, and when a transistor is ON, a high current flows but the voltage across the transistor (i.e., the drain-source voltage VDS) is small. So, switching regulators typically experience lower energy loss than, for example, linear regulators (also called low dropout (LDO) regulators) that operate in a linear region of a pass transistor. Moreover, a switching regulator's energy transfer efficiency is not highly dependent on the input voltage, and so for example in a step-down (or "buck") switching regulator the power used for the load may come from a significantly higher input voltage source.

In a typical buck switching regulator, a current is provided to a capacitor/inductor (LC) network (e.g., an LC isolate) via a control element such as a switching transistor. The inductor is alternately energized and de-energized in response to a switching pulse (e.g., a pulse width modulated (PWM) signal) applied to the switching transistor, so the current provided to the LC isolate is a current pulse train. The LC isolate acts as a charge/discharge circuit, integrating the current pulses and providing a current to a load. The switching pulse may be a variable duty cycle pulse waveform, and the duty cycle of the switching pulse may be proportional to the load current demand.

One advantage of switching regulators is that as the frequency of the switching pulse increases, the sizes of inductive (L) and capacitive (C) components for the LC network may be reduced resulting in a smaller circuit. So, a practical limit is the switching speed of the switching transistor.

A current sensor is sometimes used to measure an incremental energy transfer by a switching regulator.

BRIEF DESCRIPTION OF THE DRAWINGS

To easily identify the discussion of any particular element or act, the most significant digit or digits in a reference number refer to the figure number in which that element is first introduced.

FIG. 8 illustrates a process in accordance with one or more examples.

DETAILED DESCRIPTION

Figure 1:
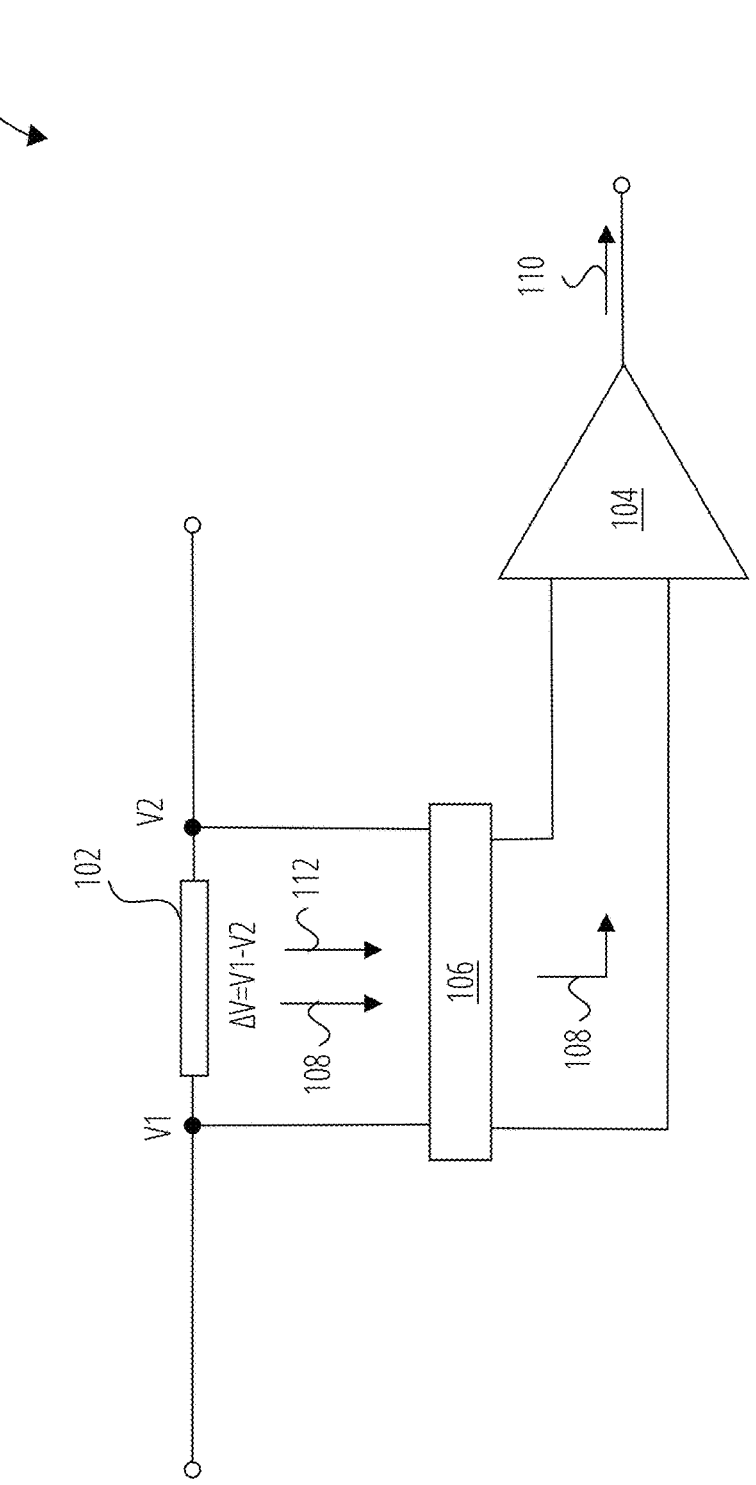
FIG. 1 is a schematic diagram depicting an apparatus to amplify differential voltage signal components of voltage across a resistor, in accordance with one or more examples.

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein—all of which are encompassed by use of the term "processor." A general-purpose processor may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code, without limitation) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

As used herein, any relational term, such as "over," "under," "on," "underlying," "upper," "lower," etc., is used for clarity and convenience in understanding the disclosure and accompanying drawings and does not connote or depend on any specific preference, orientation, or order, except where the context clearly indicates otherwise.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

The inventor of this disclosure appreciates that it can be challenging to sense a voltage signal and gain it within a short window of time when there is an unknown large common mode voltage present. For example, duty cycles can be very short, and in the case of high side sensing on high voltage switching regulators, there is very little time for sensing. For direct current resistance (DCR) current sensing it is desirable to reduce the magnitude of bias current for the amplifier, i.e., the gain element. Further, it is desirable if such an amplifier to ground sense (sense a current on a ground wire) utilizing a voltage signal and negative sense (e.g., sense a current in applications where voltage is negative) utilizing a voltage signal. The inventor of this disclosure appreciates that it would be desirable to have an amplifier with a high bandwidth and limited input bias current to sense differential voltages in the presence of common mode voltages.

FIG. 1 is a schematic diagram depicting an apparatus 100 to amplify a differential voltage signal component of a voltage across a resistor, in accordance with one or more examples. An amplified differential voltage signal may be utilized, as a non-limiting example, in a differential current sensing topology.

Apparatus 100 includes a resistor 102, a differential amplification circuit 104, and an operative coupling 106. Differential amplification circuit 104 and resistor 102 are coupled to amplify a differential voltage signal component 108 of a voltage across resistor 102 (voltage $\Delta V$). The voltage across resistor 102 is a difference between a voltage at a first end of resistor 102 (voltage V1) and a voltage at a second end of resistor 102 (voltage V2). Voltages V1 and V2 may respectively include a common mode voltage signal component 112, e.g., a common mode voltage (VCM).

Operative coupling 106 is between resistor 102 and differential amplification circuit 104 to pass differential voltage signal component 108 and isolate common mode voltage signal component 112 of the voltage ΔV across the resistor 102. More specifically, operative coupling 106 operates to provide V2-VCM to a second input terminal of differential amplification circuit 104 and provide V1-VCM to a first input terminal of differential amplification circuit 104. Optionally, operative coupling 106 may operate to provide a controlled common mode voltage (VCCM) to first and second input terminals of differential amplification circuit 104 together with voltages V2-VCM and V1-VCM, as discussed below.

In one or more examples, operative coupling 106 operates to pass differential voltage signal component 108 and isolate common mode voltage signal component 112 of the voltage ΔV via multiple integration and transfer phases performed, as a non-limiting example, at least partially responsive to a control signal (control signal not depicted). Differential amplification circuit 104 amplifies the differential voltage signal component 108 to generate amplified differential voltage signal component 110.

Figure 2:
FIG. 2 is a schematic diagram of an operative coupling in accordance with one or more examples.

FIG. 2 is a schematic diagram of an operative coupling 200 in accordance with one or more examples. Operative coupling 200 is a non-limiting example of an operative coupling 106 of FIG. 1.

In one or more examples, capacitors are utilized to pass charge. Capacitors are passive devices and so do not utilize constant current to operate. Further, the operative coupling 200 does not use current to signal bias the circuit. Accordingly, dq/dt (change in charge/change in time) via operative coupling 200 may be smaller than typical amplifier inputs and topologies.

Operative coupling 200 includes a first pair of capacitors 204, a second pair of capacitors 206, a controlled common mode voltage source 208, first switches 214, and second switches 216. FIG. 2 depicts an optional resistor 202 for ease of illustration and discussion, the outline of which is depicted using a dashed line.

First pair of capacitors 204 is switchably coupled between a negative input terminal of a differential amplification circuit and resistor 202, which negative input terminal may also be referred to herein as "first input terminal." Second pair of capacitors 206 is switchably coupled between a positive input terminal of a differential amplification circuit and resistor 202, which positive input terminal may also be referred to herein as a "second input terminal."

Respective first switches 214 are to couple a respective bottom plate of the first pair of capacitors 204 with the negative input terminal of a differential amplification circuit or a controlled common mode voltage source 208, and to couple the respective bottom plate of second pair of capacitors 206 with the positive input terminal of the differential amplification circuit or the controlled common mode voltage source 208. Respective second switches 216 are to couple a respective top plate of the first and second pairs of capacitors 204, 206 with a first end 210 of resistor 202 or a second end 212 of resistor 202. Examples of switches include, but are not limited to, Silicon Carbide (SiC) devices and Insulated-Gate Bipolar Transistors (IGBT) devices.

Controlled common mode voltage source 208 provides a controlled common mode voltage (VCCM) to node 218. Node 218 is switchably coupled to respective bottom plates of first pair of capacitors 204 and second pair of capacitors 206 via respective first switches 214. When one or more capacitors of first pair of capacitors 204 and second pair of capacitors 206 are in an integrating phase, they integrate voltage VCCM together with the differential voltage signal component and transfer the differential voltage signal component and VCCM together during a transfer phase, as further described below. Any voltage source for reliably providing a known voltage level may be utilized as controlled common mode voltage source 208.

First switches 214 and second switches 216 receive and operate responsive to control signals (control signal not depicted) that selectively turn ON or turn OFF respective ones of first switches 214 and second switches 216. When the respective switches of first switches 214 and second switches 216 are ON they transfer current, and when they are OFF they do not transfer current or transfer negligible current.

When first switches 214 and second switches 216 are alternately turned ON and OFF in a specific manner, respective capacitors of first pair of capacitors 204 and second pair of capacitors 206 alternate between integration and transfer in a complementary and commutating manner. When first pair of capacitors 204 and second pair of capacitors 206 alternate between integration and transfer at a sufficiently high frequency (e.g., substantially 200 megahertz (MHz) or higher, without limitation), an output signal is generated and continuously applied to the positive and negative input terminals of a differential amplification circuit—i.e., the output signal maintains fidelity with the positive and negative input terminals of the differential amplification circuit.

The amplitude of the output signal is, generally, proportional to the voltage level of the differential voltage signal component. If first pair of capacitors 204 and second pair of capacitors 206 alternate between integration and transfer at less than a sufficiently high frequency, then inconsistencies in the signal levels exhibited by the output signal are resolvable by a differential amplification circuit. When alternating at sufficiently high frequency, such inconsistencies in the signal levels exhibited by the output signal are unresolvable by the differential amplification circuit, and thus the fidelity of the connection is maintained.

In one or more examples, operative coupling 200 operates as an alternating current (AC) voltage shorter and a direct current (DC) voltage isolator in response to operation of first pair of capacitors 204 and second pair of capacitors 206 in a specific manner. Common mode voltage is a DC voltage and (absent outside influences) does not change (or negligibly changes) and there is no AC common mode voltage to store across the capacitor, thus the common mode voltage is not transferred as an input voltage, thus providing a DC voltage isolation.

Figure 3:
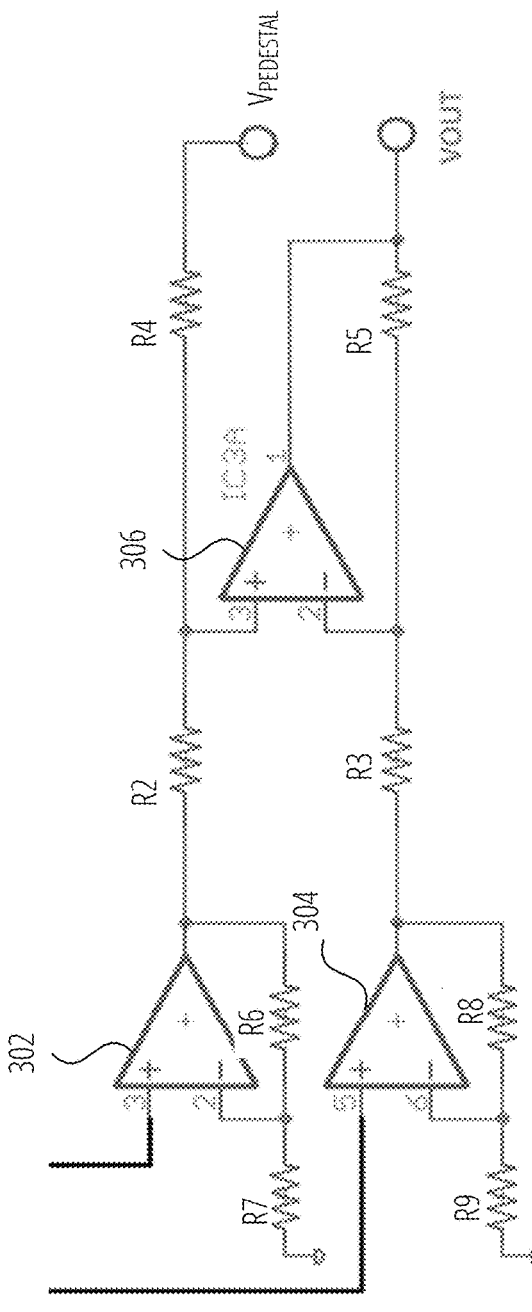
FIG. 3 is a diagram depicting a differential amplification circuit in accordance with one or more examples.

FIG. 3 is a diagram depicting a differential amplification circuit 300 in accordance with one or more examples. Differential amplification circuit 300 is a non-limiting example of a differential amplification circuit 104 of FIG. 1.

Differential amplification circuit 300 includes a first differential amplifier 302, a second differential amplifier 304, and a third differential amplifier 306. Respective positive input terminals of first differential amplifier 302 and second differential amplifier 304 may be coupled to the respective first (positive) and second (negative) input terminals of operative coupling 106 or operative coupling 200. Respective negative input terminals of first and second differential amplifiers 302 and 304 are coupled to internal nodes of respective resistive voltage divider circuits (including resistors R6/R7, and R8/R9, respectively) respectively coupled between ground and respective outputs of first differential amplifier 302 and second differential amplifier 304. Utilization of the resistive voltage divider circuits is optional to divide the gain and increase the speed of first differential amplifier 302 and second differential amplifier 304. An output of first differential amplifier 302 is coupled to a positive input terminal of third differential amplifier 306 via resistor R2 and an output of second differential amplifier 304 is coupled to a negative input terminal of third differential amplifier 306 via resistor R3. The positive input terminal of third differential amplifier 306 is further coupled to a pedestal voltage via resistor R4. It will be appreciated that the pedestal voltage is utilized to set the output voltage from which to reference (above or below) positive or negative differential signal swings. The negative input terminal of third differential amplifier 306 is further coupled to an output terminal of differential amplification circuit 300 via resistor R5, which output terminal is coupled to the output of third differential amplifier 306. The number of resistors utilized in differential amplification circuit 300 is for example only and does not limit the scope of the disclosure in any way.

Figure 4:
FIG. 4 is a diagram depicting an operative coupling in accordance with one or more examples.
Figure 4:
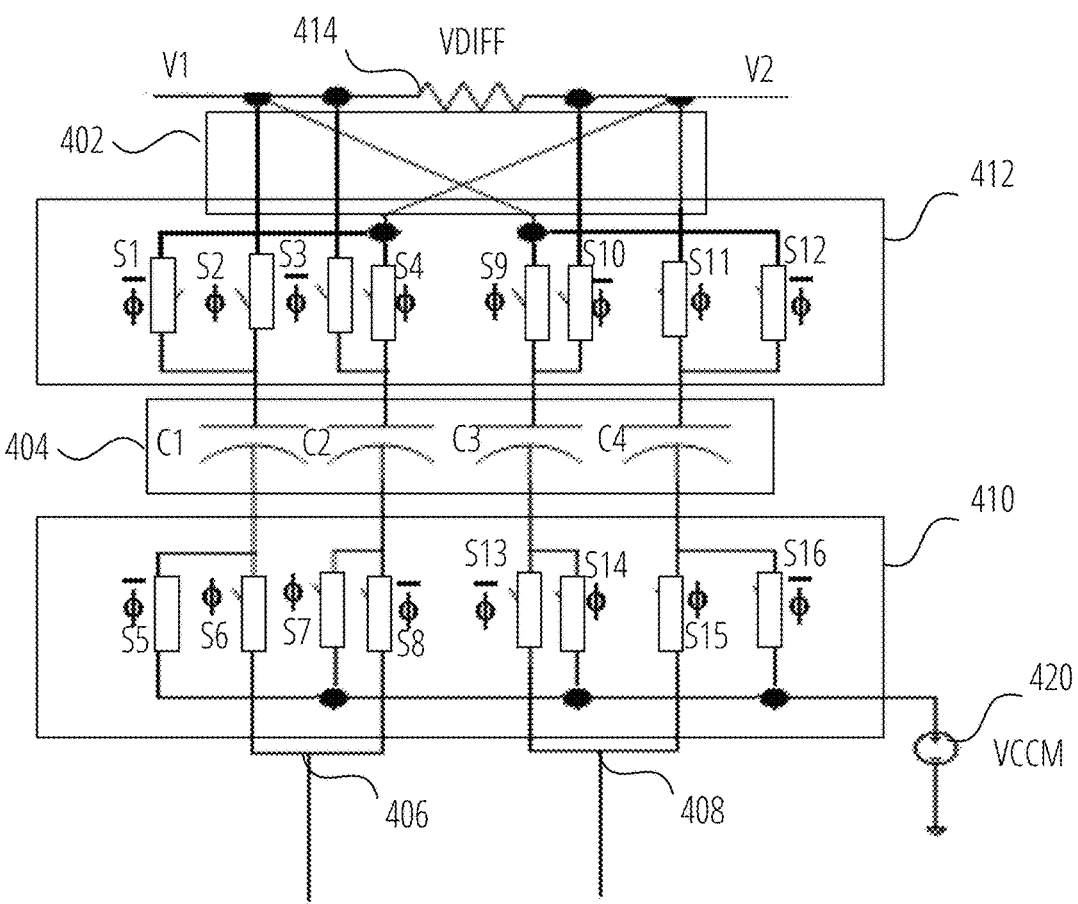
Figure 4:
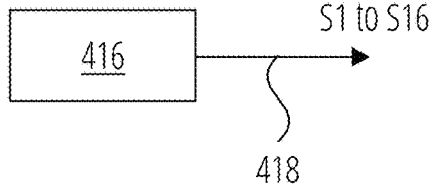

FIG. 4 is a diagram depicting an operative coupling 400 in accordance with one or more examples. Operative coupling 400 is a non-limiting example of an operative coupling 200 or operative coupling 106. Operative coupling 400 includes capacitors 404, first switches 410, second switches 412, and cross coupling circuit 402. Also depicted for ease of illustration and discussion is an optional resistor 414. Arrangement of capacitors 404, first switches 410, second switches 412, and controlled common mode voltage source 420 is substantially the same as described for first pair of capacitors 204 (corresponding to capacitors C1 and C2 in FIG. 4), second pair of capacitors 206 (corresponding to capacitors C3 and C4 in FIG. 4), first switches 214, second switches 216, and controlled common mode voltage source 208 of FIG. 2.

Respective switches of first switches 410 and second switches 412 are labeled as switches S1 to S16, and respective capacitors of capacitors 404 are labelled as capacitors C1 to C4. Logic circuit 416 operates to generate control signal to turn ON or OFF respective switches S1 to S16 as discussed below.

Pairs of switches of second switches 412 are coupled to respective top plates of capacitors C1 and C2. For example, a first terminal of integrating switch pair S1/S2 is coupled to a top plate of capacitor C1, and a first terminal of integrating switch pair S3/S4 is coupled to a top plate of capacitor C2, a first terminal of integrating switch pair S9/S10 is coupled to a top plate of capacitor C3 and a first terminal of integrating switch pair S11/S12 is coupled to a top plate of capacitor C4.

Second switches 412 are coupled by cross coupling circuit 402 to higher voltage V1 and lower voltage V2 sides of resistor 414, so denoted because in the specific example depicted by FIG. 4, there is a voltage drop from V1 to V2, the voltage drop denoted Vdiff, and input terminals of operative coupling 400 are cross-coupled via cross coupling circuit 402 to impress that voltage drop across the operative coupling 400.

Capacitors C1, C2, and switches S1 to S8 form a first sensed voltage path from resistor 414 to first node 406, and capacitors C3, C4 and switches S9 to S16 form a second sensed voltage path from resistor 414 to second node 408. First node 406 and second node 408 are operable to couple a first/negative input terminal and a second/positive input terminal of a differential amplification circuit. When first node and 406 and second node 408 are coupled to first and second input terminals of a differential amplification circuit, the feedback of the amplification circuit generates a virtual ground.

Pairs of the capacitors of capacitors 404 operate (i.e., alternate between integrating and transferring charge) in a complementary manner to apply a differential voltage signal component of Vdiff to first node 406 and second node 408. Using capacitors C1 and C2 as an example, capacitors C1 and C2 operate as a complimentary integrating/transferring pair: when C1 integrates, C2 transfers, and when C1 transfers, C2 integrates. Similarly, capacitors C3 and C4 operate as a complimentary integrating/transferring pair.

FIG. 4 depicts phase indicators next to switches S1 to S16 of second switches 412 and first switches 410 to illustrate whether a given switch is ON or OFF during an example phase of operation. A "φ" with a "-" over it denotes that the switch is OFF during a first phase and ON during a second phase. A "φ" without a "-" over it denotes that the switch is ON during a first phase and OFF during a second phase.

As a non-limiting example, during a first phase, S1/S3 and S5/S8 are OFF, and S2/S4 and S6/S7 are ON. Capacitor C1 is coupled between voltage V1 and first node 406, so the voltage across capacitor C1 is V1. Capacitor C2 is coupled between voltage V2 and voltage VCCM, and so the voltage across capacitor C2 is V2-VCCM, or (V1-Vdiff)–VCCM. Similarly, during a first phase, S9/S11 and S14/S15 are OFF, S10/S12 and S13/S16 are ON. Capacitor C3 is coupled between voltage V1 and voltage VCCM, so the voltage across capacitor C3 is V1-VCCM. Capacitor C4 is coupled between voltage V2 and node 408, so the voltage across capacitor C4 is V2, or (V1-Vdiff).

In a next, second, phase, S1/S3 and S5/S8 are ON, and S2/S4 and S6/S7 are OFF. Capacitor C1 is coupled between V2 and voltage VCCM, and so the voltage across capacitor C1 changes from V1 to (V1-Vdiff)–VCCM. Capacitor C2 is coupled between V1 and first node 406, and since the voltage across capacitor C2 was V1-Vdiff–VCCM, the voltage at first node 406 is expressed as V1–(V1-Vdiff–VCCM)=Vdiff+VCCM.

Similarly, in the second phase, S9/S11 and S14/S15 are ON, S10/S12 and S13/S16 are OFF. Capacitor C4 is coupled between voltage V1 and voltage VCCM so the voltage across capacitor C4 changes from V1-Vdiff to V1-VCCM. Capacitor C3 is coupled between voltage V2 and node 408, and since the voltage across capacitor C3 was V1-VCCM, the voltage at node 408 is expressed as V1-Vdiff–(V1-VCCM)=Vdiff+VCCM. Accordingly, a differential output voltage, Vout, may be expressed as the difference between the voltages at first and second nodes 406 and 408 after the second phase, and may be expressed as: Vdiff+VCCM–(Vdiff+VCCM)=–2Vdiff.

The change in voltage caused by turning OFF and ON switches S1-S16 initiates integration and transfer by capacitors 404. More specifically, in the non-limiting example discussed above, during the first phase, capacitors C2 and C3 operate to integrate the differential voltage signal component Vdiff with 2× gain, and during the second phase, capacitors C2 and C3 operate to transfer the differential voltage signal component Vdiff with 2× gain together with the controlled common mode voltage VCCM to first and second nodes 406 and 408. Further, during the first phase, capacitors C1 and C4 operate to transfer the differential voltage signal component Vdiff with 2× gain together with the controlled common mode voltage VCCM to first and second nodes 406 and 408, and during the second phase capacitors C1 and C4 operate to integrate the differential voltage signal component Vdiff with 2× gain. By alternating between integration and transfer as discussed above, operative coupling 400 operates to pass the differential voltage signal component Vdiff while isolating the common mode voltage components of V1 and V2.

Sufficiently frequent switching between ON and OFF enables the AC coupling and DC isolation discussed herein. Sufficiently fast switching maintains the fidelity of the signal at the output of operative coupling 106, operative coupling 200 and operative coupling 400 and therefore inputs of a differential amplification circuit. However, some switching noise may be injected into the signal. In one or more examples, switching noise may be reduced by selecting switches with a size that reduces parasitic current and still passes the voltage signal. In one or more examples, positive or negative charge may be applied via a charge cancellation circuit (not depicted) to reduce charge injected by switching noise.

In one or more examples, respective capacitors of capacitors 404 may be utilized in a "dual channel" arrangement, where two lines (e.g., electrical connections, without limitation) are utilized to keep the inputs of the amplification circuit constantly electrically coupled to voltages V1 and V2, which creates real-time sampling and doubles the effective sampling frequency. In other examples, a single capacitor could be used for both voltage paths with higher switching speeds.

Figure 5:
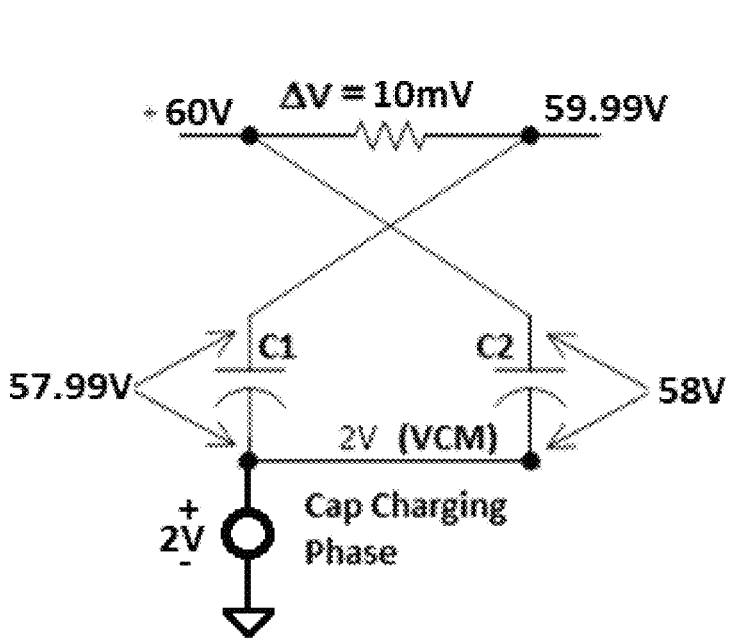
FIG. 5 is a diagram depicting a first phase of an example operation of an operative coupling, in accordance with one or more examples.
Figure 6:
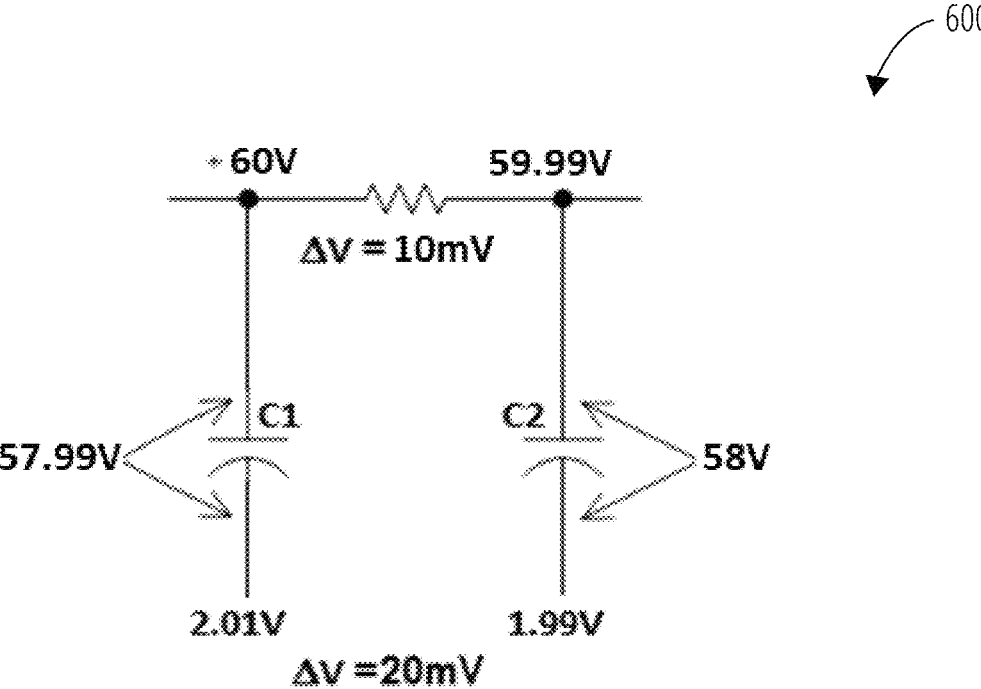
FIG. 6 is a diagram depicting a second phase of the example operation of the operative coupling of FIG. 5, in accordance with one or more examples.

FIG. 5 and FIG. 6 are schematic diagrams depicting a non-limiting example 500 and non-limiting example 600, of operation of operative coupling 106, operative coupling 200 or operative coupling 400 given a 10 mV input differential voltage signal component with a 60V common mode voltage component. At phase 500 depicted by FIG. 5, the top plate of capacitor C1 is coupled to 59.99V and the bottom plate of capacitor C1 is coupled to 2V, so the voltage across capacitor C1 is 57.99V. Further, the top plate of capacitor C2 is coupled to 60V and the bottom plate of capacitor C1 is coupled to 2V, so the voltage across capacitor C1 is 58V. At phase 600 depicted by FIG. 6, the top plate of capacitor C1 is coupled to 60V and the voltage across C1 remains 57.99V, so the voltage at the node coupled to the bottom plate of C1 is 2.01V (60V−57.99V=2.01V). Further, the top plate of capacitor C2 is coupled to 59.99V and the voltage across C2 remains 58V, so the voltage at the node coupled to the bottom plate of C2 is 1.99V (59.99V−58V=1.99V). Accordingly, in the contemplated example, the input differential voltage signal component of 10 mV is translated to a 20 mV differential voltage signal component (2.01V−1.99V=20 mV) and a 2V controlled common mode voltage component.

Figure 7:
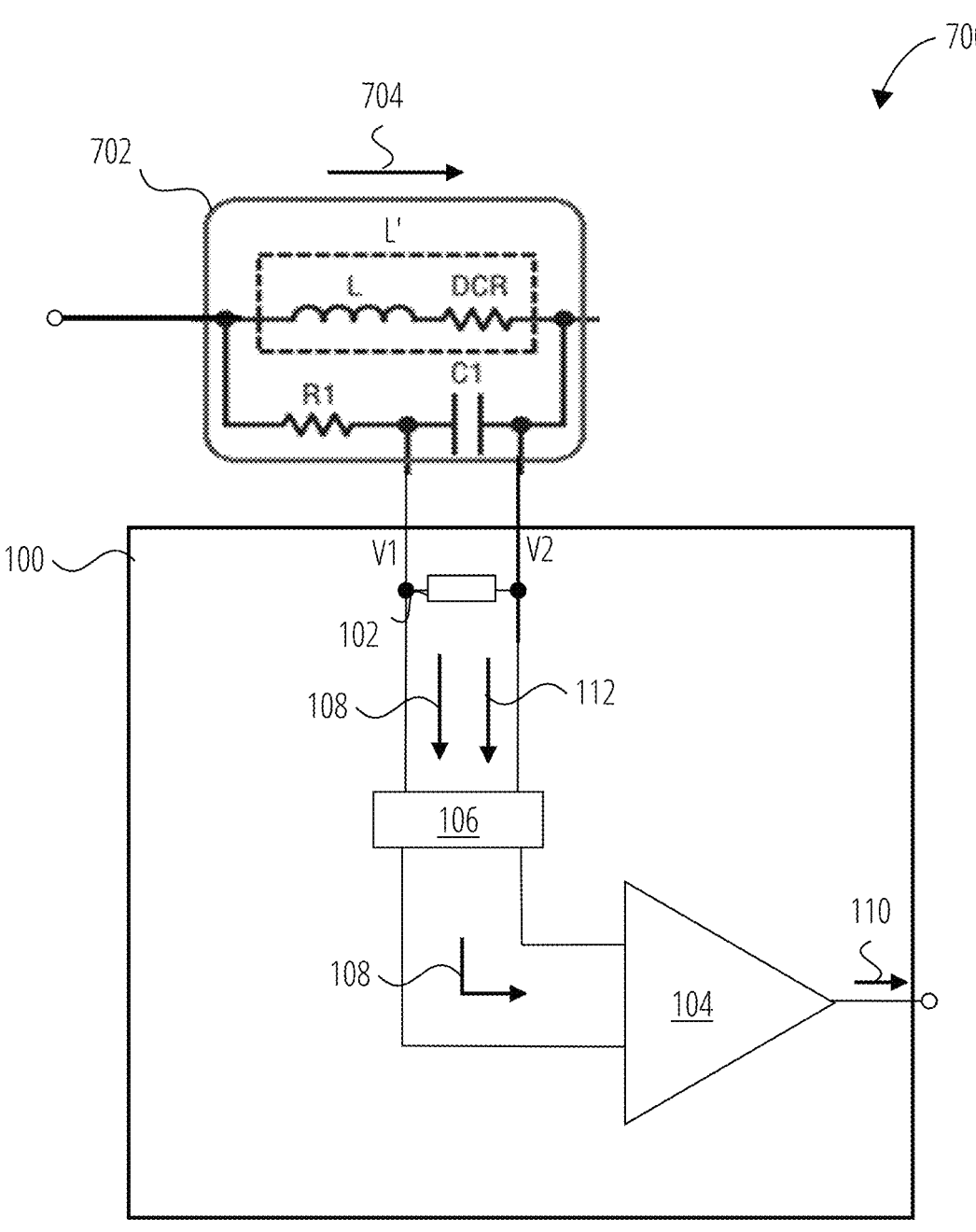
FIG. 7 is a schematic diagram depicting a system 700 for direct current sensing, in accordance with one or more examples.

FIG. 7 is a schematic diagram depicting a system 700 having a direct current sensing topology in accordance with one or more examples. System 700 includes DCR sensing circuit 702 and apparatus 100. DCR sensing circuit 702 includes inductor L' represented by an ideal inductor L coupled in series with DC resistor DCR, resistor R1, and capacitor C1. Resistor R1 and capacitor C1 are coupled in series, and series-coupled resistor R1 and capacitor C1 are coupled in parallel with inductor L'. In the example depicted by FIG. 7, apparatus 100 may also be characterized as an input 100 for, as a non-limiting example, current measurement logic to generate a value representing current signal 704.

In a contemplated operation, the inductor current, which is current signal 704, is sensed as a voltage across capacitor C1. The voltage across capacitor C1 is duplicated across resistor 102, thus the difference between voltages V1 and V2 is indicative of the voltage across capacitor C1 and current signal 704. Apparatus 100 is utilized to input the differential voltage signal component 108 of voltages V1 and V2 for current sensing, and more specifically, to amplify and input differential voltage signal component 108 for sensing current signal 704.

The topology of system 700 may be utilized for direct current sensing in applications where current signals are utilized, as non-limiting examples, to determine load-line droop, per-phase current balance, current reporting, and over current protection. System 700, including apparatus 100, may be utilized in ground sensing and other negative sensing applications where unknown common mode voltage signals may affect voltage V1 and voltage V2.

FIG. 8 is a flow diagram depicting a process 800 to amplify differential voltage signal components of voltage across a resistor, in accordance with one or more examples.

In operation 802, process 800 receives a voltage generated across a resistor (e.g., a resistor, without limitation). In operation 804, process 800 provides a differential voltage signal component of the voltage generated across the resistor to inputs of a differential amplification circuit by alternately integrating and transferring the differential voltage signal component and isolating a common mode voltage component of the voltage generated across the resistor. In one or more examples, the differential voltage signal may be integrated and transferred by controlling an operative coupling disclosed herein (e.g., operative coupling 106, operative coupling, 200, or operative coupling 400, without limitation), and more specifically by controlling switches (e.g., via control signals 418 generated by logic circuit 416, without limitation) of the operative coupling (e.g., switches 204/206 or switches 410/412, without limitation) in the manner discussed above.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means some or a totality. As used herein, the term "each and every" means a totality.

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting examples of the disclosure include:

Example 1: An apparatus, comprising: a resistor; a differential amplification circuit operatively coupled with the resistor to amplify a differential voltage signal component of a voltage across the resistor; and an operative coupling between the resistor and the differential amplification circuit to pass the differential voltage signal component and isolate a common mode voltage signal component of the voltage across the resistor.

Example 2: The apparatus according to Example 1, the operative coupling comprising: a first pair of capacitors switchably coupled between a negative input terminal of the differential amplification circuit and the resistor; and a second pair of capacitors switchably coupled between a positive input terminal of the differential amplification circuit and the resistor.

Example 3: The apparatus according to any of Examples 1 and 2, wherein the operative coupling comprising: first switches to respectively couple the first pair of capacitors with the negative input terminal and to respectively couple the second pair of capacitors with the positive input terminal of the differential amplification circuit; and second switches to couple the first and second pairs of capacitors with a first end of the resistor or a second end of the resistor.

Example 4: The apparatus according to any of Examples 1 through 3, wherein respective ones of the first switches are: coupled between the first pair of capacitors and the negative input terminal of the differential amplification circuit; coupled between the first pair of capacitors and a controlled common mode voltage source; coupled between the second pair of capacitors and the positive input terminal of the differential amplification circuit; and coupled between the second pair of capacitors and the controlled common mode voltage source.

Example 5: The apparatus according to any of Examples 1 through 4, wherein respective ones of the second switches are: coupled between the first pair of capacitors and the first end of the resistor; coupled between the first pair of capacitors and the second end of the resistor; coupled between the second pair of capacitors and the first end of the resistor; and coupled between the second pair of capacitors and the second end of the resistor.

Example 6: The apparatus according to any of Examples 1 through 5, comprising a logic circuit to generate control signals to selectively turn ON or OFF respective ones of the first switches and the second switches.

Example 7: The apparatus according to any of Examples 1 through 6, wherein control signals generated by the logic circuit cause sets of the first switches and sets of the second switches to alternately integrate and transfer charge at the first and second pair of capacitors in a complementary and commutating manner.

Example 8: The apparatus according to any of Examples 1 through 7, wherein control signals generated by the logic circuit to turn ON and turn OFF the first switches and the second switches are at a predetermined frequency suitable to maintain fidelity of the differential voltage signal component with inputs of the differential amplification circuit.

Example 9: The apparatus according to any of Examples 1 through 8, wherein the differential amplification circuit comprises a first differential amplifier and a second differential amplifier, and respective outputs of the first differential amplifier and the second differential amplifier are coupled to respective ones of positive and negative input terminals of a third differential amplifier.

Example 10: A method, comprising: receiving a voltage generated across a resistor; and providing a differential voltage signal component of the voltage generated across the resistor to inputs of a differential amplification circuit by: alternately integrating and transferring the differential voltage signal component, and isolating a common mode voltage component of the voltage generated across the resistor.

Example 11. A system, comprising: a direct current sensing circuit; and an input circuit to sense a voltage signal indicative of a current signal at the direct current sensing circuit, the input circuit to pass a differential voltage signal component of the voltage signal and isolate a common mode voltage signal component of the voltage signal.

Example 12. An apparatus for operatively coupling a resistor with a differential amplification circuit, the operative coupling comprising: first switches, second switches, and capacitors coupled to pass a differential voltage signal component of a voltage across the resistor and isolate a common mode voltage signal component of the voltage across the resistor.

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:
a resistor;
a differential amplification circuit operatively coupled with the resistor to amplify a differential component of a voltage across the resistor; and
an operative coupling between the resistor and the differential amplification circuit to pass the differential component of the voltage across the resistor and isolate a common mode component of the voltage across the resistor, the operative coupling comprising first switches, second switches, and first and second pairs of capacitors arranged to alternately integrate and transfer charge in a complementary and commutating manner while isolating the common mode component.

2. The apparatus of claim 1, the operative coupling comprising:

a first pair of capacitors switchably coupled between a negative input terminal of the differential amplification circuit and the resistor; and a second pair of capacitors switchably coupled between a positive input terminal of the differential amplification circuit and the resistor.

3. The apparatus of claim 2, wherein the first switches to respectively couple the first pair of capacitors with the negative input terminal and to respectively couple the second pair of capacitors with the positive input terminal of the differential amplification circuit; and the second switches to couple the first and second pairs of capacitors with a first end of the resistor or a second end of the resistor.

4. The apparatus of claim 3, wherein respective ones of the first switches are:

coupled between the first pair of capacitors and the negative input terminal of the differential amplification circuit;

coupled between the first pair of capacitors and a controlled common mode voltage source;

coupled between the second pair of capacitors and the positive input terminal of the differential amplification circuit; and coupled between the second pair of capacitors and the controlled common mode voltage source.

5. The apparatus of claim 3, wherein respective ones of the second switches are:

coupled between the first pair of capacitors and the first end of the resistor;

coupled between the first pair of capacitors and the second end of the resistor;

coupled between the second pair of capacitors and the first end of the resistor; and coupled between the second pair of capacitors and the second end of the resistor.

6. The apparatus of claim 3, comprising a logic circuit to generate control signals to selectively turn ON or OFF respective ones of the first switches and the second switches.

7. The apparatus of claim 6, wherein control signals generated by the logic circuit cause sets of the first switches and sets of the second switches to alternately integrate and transfer charge at the first and second pair of capacitors in the complementary and commutating manner.

8. The apparatus of claim 6, wherein control signals generated by the logic circuit to turn ON and turn OFF the first switches and the second switches are at a predetermined frequency suitable to maintain fidelity of the differential component of the voltage with inputs of the differential amplification circuit.

9. The apparatus of claim 1, wherein the differential amplification circuit comprises a first differential amplifier and a second differential amplifier, and respective outputs of the first differential amplifier and the second differential amplifier are coupled to respective ones of positive and negative input terminals of a third differential amplifier.

10. A method, comprising:

receiving a voltage generated across a resistor; and providing, via an operative coupling, a differential component of the voltage generated across the resistor to inputs of a differential amplification circuit by: alternately integrating and transferring the differential component, and isolating a common mode component of the voltage generated across the resistor, the operative coupling comprising first switches, second switches, and first and second pairs of capacitors arranged to alternately integrate and transfer charge in a complementary and commutating manner while isolating the common mode component.

11. A system, comprising:

a direct current sensing circuit; and an input circuit to sense a voltage signal indicative of a current signal at the direct current sensing circuit, the input circuit to pass a differential component of the voltage signal and isolate a common mode component of the voltage signal, the input circuit comprising first switches, second switches, and first and second pairs of capacitors arranged to alternately integrate and transfer charge in a complementary and commutating manner while isolating the common mode component.

* * * * *